United States Patent
Sinozawa

(10) Patent No.: US 7,030,025 B2
(45) Date of Patent: Apr. 18, 2006

(54) METHOD OF MANUFACTURING FLOTOX TYPE EEPROM

(75) Inventor: Masahiko Sinozawa, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 188 days.

(21) Appl. No.: 10/797,127

(22) Filed: Mar. 11, 2004

(65) Prior Publication Data
US 2005/0101152 A1 May 12, 2005

(30) Foreign Application Priority Data
Nov. 7, 2003 (JP) ............................. 2003-378220

(51) Int. Cl.
*H01L 21/302* (2006.01)
*H01L 21/3065* (2006.01)

(52) U.S. Cl. ................. 438/704; 438/706; 438/745

(58) Field of Classification Search ............... 438/704, 438/706, 745
See application file for complete search history.

(56) References Cited

U.S. PATENT DOCUMENTS

| | | | |
|---|---|---|---|
| 4,477,825 A | 10/1984 | Yaron et al. | 257/321 |
| 4,701,776 A | 10/1987 | Perlegos et al. | 257/321 |
| 5,491,101 A * | 2/1996 | Miyamoto et al. | 438/257 |
| 6,165,846 A * | 12/2000 | Carns et al. | 438/264 |
| 6,586,765 B1 * | 7/2003 | Lin et al. | 257/48 |

FOREIGN PATENT DOCUMENTS

| | | |
|---|---|---|
| JP | 61-228672 | 10/1986 |
| JP | 04-145666 | 5/1992 |
| JP | 04-207084 | 7/1992 |
| JP | 2001-210730 | 8/2001 |

\* cited by examiner

*Primary Examiner*—Nadine G. Norton
*Assistant Examiner*—Lynette T. Umez-Eronini
(74) *Attorney, Agent, or Firm*—Volentine Francos & Whitt, PLLC

(57) ABSTRACT

Disclosed herein is a method of manufacturing a FLOTOX type EEPROM. According to the method, the thickness of an oxide film in a tunneling implanted region is formed thicker than that of an oxide film in a peripheral active region by use of enhanced oxidation of the tunneling implanted region. Then, a tunnel window region and the peripheral active region are dry-etched simultaneously and an etching end point of the peripheral active region is detected. Thereafter, the oxide film that remains in the tunnel window region is removed by wet etching.

4 Claims, 4 Drawing Sheets

METHOD OF MANUFACTURING FLOTOX TYPE EEPROM

BACKGROUND OF THE INVENTION

1. Field of the Invention

The present invention relates to a method of manufacturing a FLOTOX type EEPROM, and particularly to a method of forming a tunnel oxide film region.

2. Description of the Related Art

A method of manufacturing a FLOTOX (FLOating gate Tunnel Oxide) type EEPROM, according to a prior art is shown in FIGS. 1 through 4. A field oxide film 2 corresponding to a device or element isolation region is formed on a P type silicon substrate 1 by a LOCOS method. After a silicon nitride film employed in a LOCOS process has been removed, boron ions are selectively injected directly below the field oxide film 2 to form a channel stop region 3. Then, N type ions such as phosphorus ions are selectively injected and annealing is effected to form a tunneling implanted region 4 corresponding to an N type diffusion region formed with a tunnel oxide film (see FIG. 1).

Subsequently, the entire surface of the substrate, containing an exposed active region is oxidized about 30 nm to form a gate oxide film 5. A resist 6 is applied thereonto and thereafter subjected to resist patterning to form a tunnel window opening 7 on its corresponding tunneling implanted region 4 (see FIG. 2). The gate oxide film 5 in the tunnel window opening 7 is etched by a wet etching solution such as hydrofluoric acid to expose part of the tunneling implanted region 4, followed by removal of the resist 6.

Then, the entire surface of the substrate is oxidized about 10 nm to form a locally thin tunnel oxide film 9 having a thickness of about 10 nm and a re-oxidized gate oxide film 10 in a tunnel window region 8 (see FIG. 3). Thereafter, polysilicon is deposited and subjected to patterning to thereby form a floating gate electrode 11 so as to cover the tunnel window region 8 (see FIG. 4). Although not shown in the figure, a control gate electrode, wiring and the like are thereafter formed, thereby leading to completion of the FLOTOX type EEPROM.

Japanese Unexamined Patent Publication No. Sho 61(1986)-228672

Japanese Unexamined Patent Publication No. Hei 4(1992)-145666

Japanese Unexamined Patent Publication No. Hei 4(1992)-207084

Japanese Unexamined Patent Publication No. 2001-210730

In the manufacturing method according to the prior art, however, the thick gate oxide film is processed using the wet etching solution in the tunnel window region etching process for the formation of the tunnel oxide film. Therefore, an opening in an actual tunnel window region becomes large as compared with a resist's pattern, thus leading to a large factor that inhibits a reduction in cell size.

When the opening of the tunnel window region is performed by a dry etching method, a problem arises in that etching damage which is a problem peculiar to dry etching, occurs, thereby deteriorating the quality of a subsequent tunnel oxide film. Further, a problem arises in that since the open area of the tunnel window region is small, the detection of an end point of dry etching becomes difficult.

SUMMARY OF THE INVENTION

The present invention has been made in view of the above problems. There is provided a method of manufacturing an EEPROM, according to the present invention. According to the method, a tunneling implanted region and a peripheral active region of an EEPROM memory cell are simultaneously oxidized, and the thickness of an oxide film on the tunneling implanted region is set so as to become thicker than the thickness of each of oxide films on an active region other than the tunneling implanted region by enhanced oxidation of the tunneling implanted region. Then a resist is applied onto the entire surface of a substrate, and a partial tunnel window region on the tunneling implanted region and the resist of an active region in a peripheral transistor forming region other than the memory cell are opened. Etching is done until the oxide film in the peripheral transistor forming region is perfectly removed by dry etching. Thereafter, the oxide film remaining in the tunneling implanted region of the memory cell is removed by wet etching, thereby opening and forming a tunnel window region corresponding to a region for forming a locally thin oxide film.

Since the oxide film on the tunneling implanted region of the memory cell and the oxide film of the peripheral active region thereon are simultaneously dry etched, control on the detection of an etching end point becomes easy with an increase in etching area. Since the oxide film is formed thicker than the simultaneously formed oxide film of the peripheral active region by use of the enhanced oxidation, the oxide film remains in the tunnel window section upon the end point detection of the dry etching. Hence, substrate etching damage can be reduced. Thus, the scale down or miniaturization of the tunnel window section can be realized by using dry etching while etching damage is being avoided.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

A preferred embodiment of the present invention will hereinafter be described with reference to the accompanying drawings.

Figure 1:
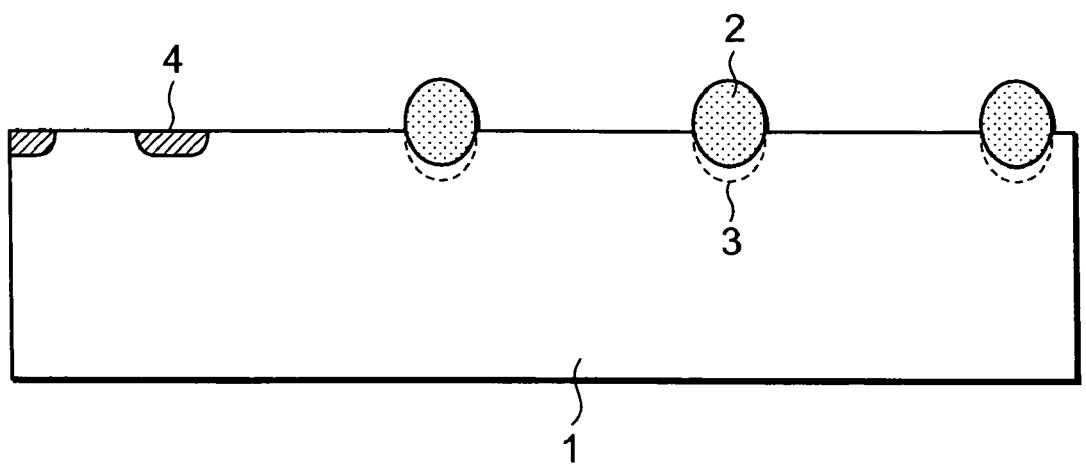
FIG. 1 is a process sectional view showing a method of manufacturing a FLOTOX type EEPROM, according to a prior art.
Figure 2:
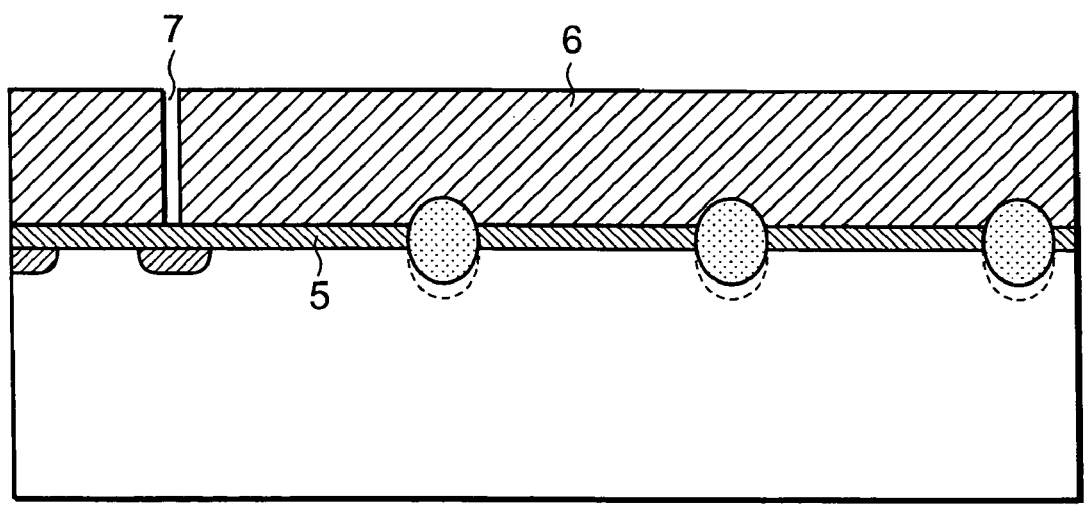
FIG. 2 is a process sectional view illustrating the FLOTOX type EEPROM manufacturing method according to the prior art following FIG. 1.
Figure 3:
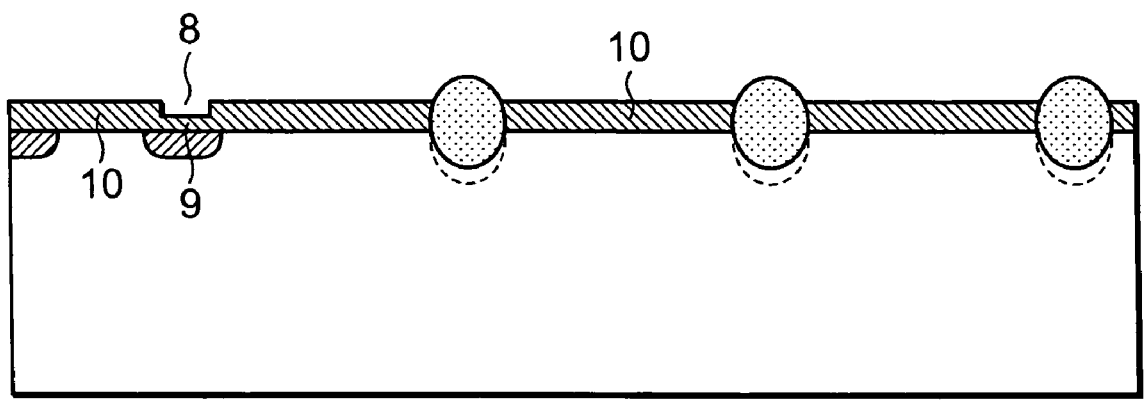
FIG. 3 is a process sectional view depicting the FLOTOX type EEPROM manufacturing method according to the prior art following FIG. 2.
Figure 4:
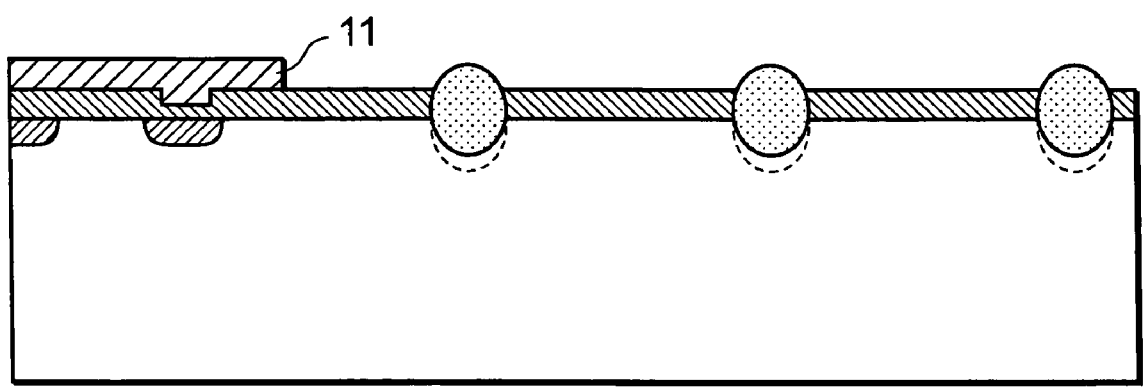
FIG. 4 is a process sectional view showing the FLOTOX type EEPROM manufacturing method according to the prior art following FIG. 3.

FIGS. 5 through 8 are respectively process sectional views showing an embodiment of the present invention. A field oxide film 22, a channel stop region 23 and a tunneling implanted region 24 are formed on a P type silicon substrate 21 (see FIG. 1).

Figure 5:
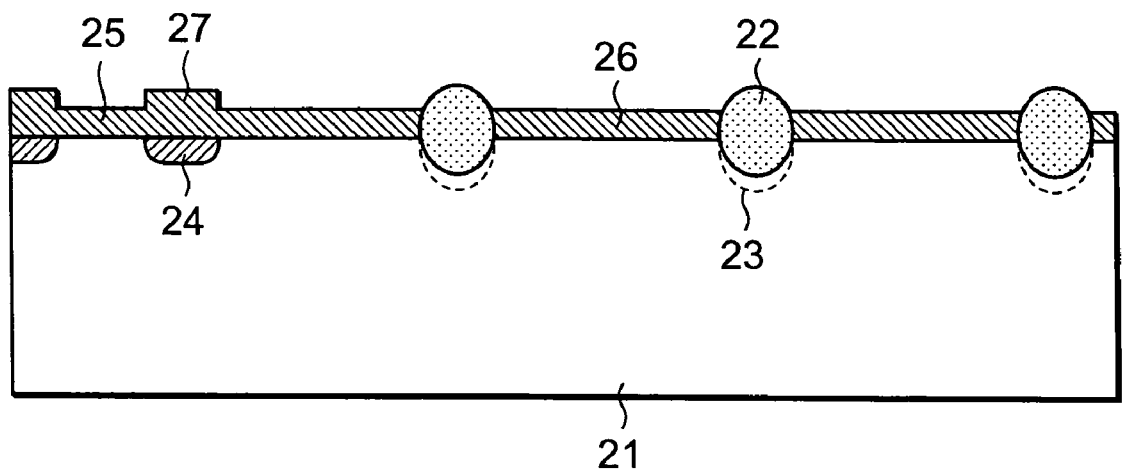
FIG. 5 is a process sectional view illustrating a method of manufacturing a FLOTOX type EEPROM, according to an embodiment of the present invention.
Figure 6:
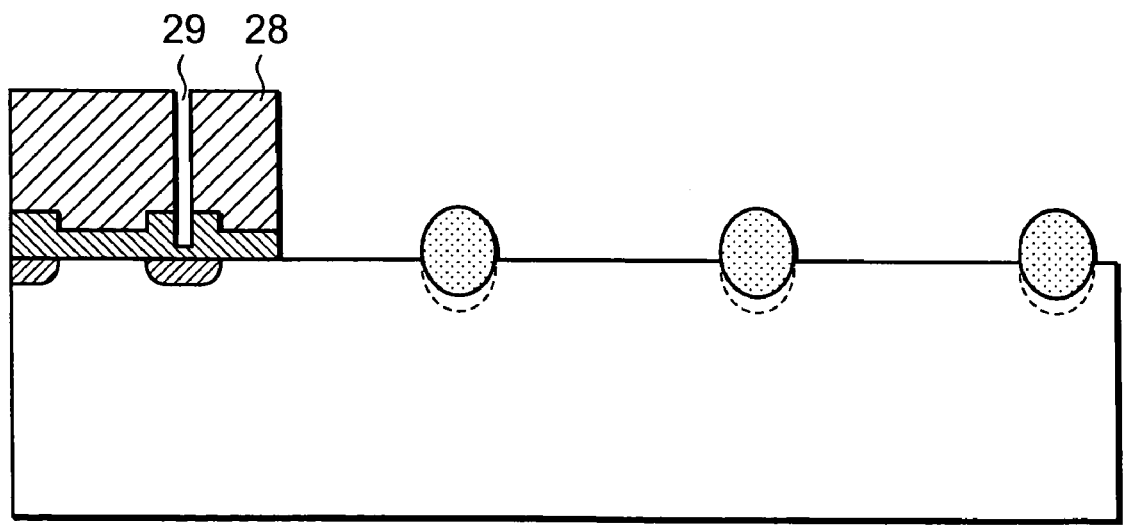
FIG. 6 is a process sectional view depicting the FLOTOX type EEPROM manufacturing method according to the embodiment of the present invention following FIG. 5.

Then the whole surface of the substrate, which contains an exposed active region, is oxidized about 30 nm to form a gate oxide film 25 of an EEPROM cell section and an oxide film 26 for a peripheral active region (see FIG. 5). Since, at this time, the tunneling implanted region 24 is oxidized in advance without being subjected to annealing, the thickness of an oxide film 27 on the tunneling implanted region 24 is formed thicker than other oxide films 25 and 26 each lying in the active region owing to the effect of enhanced oxidation.

Next, a resist is applied onto the entire surface to form a resist pattern 28. A tunnel window opening 29 and a peripheral transistor region other than a memory cell region are exposed. With the resist pattern 28 as a mask, dry etching is carried out until the silicon substrate corresponding to a portion constituting the active region other than the filed oxide film 22 of the peripheral transistor section is exposed (see FIG. 6).

Since the thickness of a gate oxide film is thicker than other portion at the tunnel window opening 29 at this time, the oxide film 26 in the peripheral transistor region is perfectly removed and the silicon substrate is not exposed. That is, the tunneling implanted region 25 in the tunnel window opening 29 is not subjected to damage of dry etching. Since the oxide film 26 in the peripheral transistor region is also dry etched as well as the oxide film 27 at the tunnel window opening 29, the detection of an etching end point becomes easy.

Figure 7:
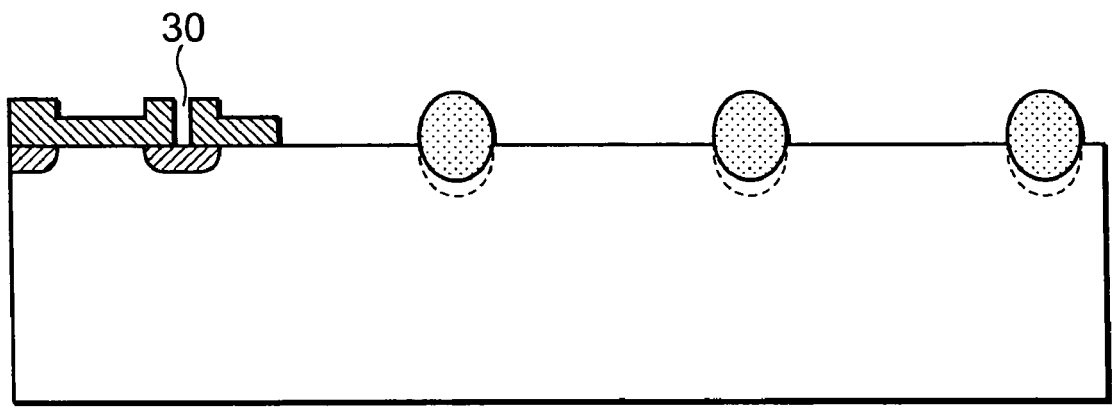
FIG. 7 is a process sectional view showing the FLOTOX type EEPROM manufacturing method according to the embodiment of the present invention following FIG. 6.
Figure 8:
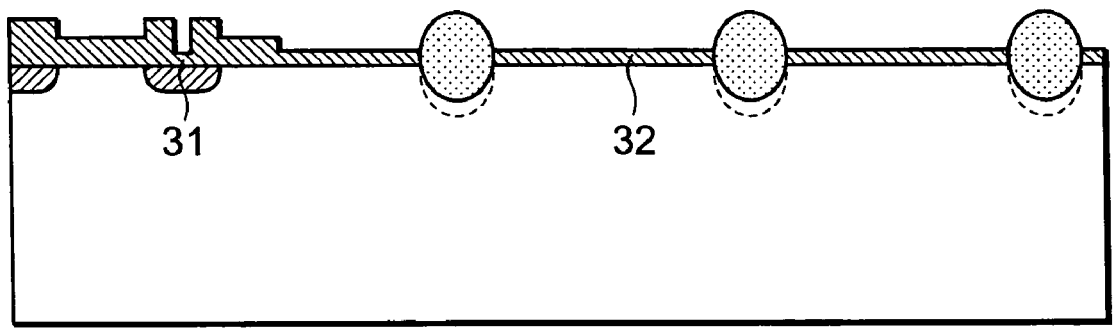
FIG. 8 is a process sectional view illustrating the FLO-TOX type EEPROM manufacturing method according to the embodiment of the present invention following FIG. 7.

Subsequently, wet etching is done to expose the silicon substrate of the tunnel window opening 29, so that a tunnel window region 30 is formed (see FIG. 7). After removal of the resist 28, the entire surface is oxidized about 10 nm to form a tunnel oxide film 31 and form an oxide film 32 in the peripheral active region (see FIG. 8). Thereafter, although not shown in the drawing, a floating gate electrode, a control gate electrode, wiring and the like are formed by a method similar to the prior art, thus leading to the completion of a FLOTOX type EEPROM.

According to the present embodiment as described above, the enhanced oxidation of the tunneling implanted region is utilized and the peripheral active portion is made open by dry etching, thereby making it possible to control the end point detection of dry etching. It is therefore possible to make uniform the remaining film of the gate oxide film in the tunnel window portion. Since the remaining film is opened by wet etching, the amount of wet etching can be reduced as compared with the prior art, thus making it possible to reduce variations in the dimension of the diameter of the tunnel window opening.

While the present invention has been described with reference to the illustrative embodiment, this description is not intended to be construed in a limiting sense. Various modifications of the illustrative embodiment, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing an EEPROM having a locally thin oxide film, comprising the following steps of:
   forming a diffusion region in part of a memory cell in an active region on a silicon substrate;
   forming the thickness of an oxide film on the diffusion region so as to become thicker than the thickness of each of oxide films each lying on an active region other than the diffusion region by oxidation treatment;
   applying a resist and opening part thereof on the diffusion region and an active region in a peripheral transistor forming region other than the memory cell;
   performing etching until the oxide film of the peripheral transistor forming region is removed by a dry etching method;
   removing the oxide film remaining in the opening of the memory cell by a wet etching method; and
   then removing the resist.

2. The method according to claim 1, wherein the EEPROM is a FLOTOX type.

3. The method according to claim 1, wherein oxidation on the diffusion region and oxidation on the active region other than the diffusion region are simultaneously performed.

4. The method according to claim 3, wherein the oxidation on the diffusion region is enhanced oxidation.

\* \* \* \* \*